United States Patent
Lee et al.

(10) Patent No.: US 7,233,496 B2
(45) Date of Patent: Jun. 19, 2007

(54) HEAT DISSIPATION DEVICE INCLUDING WIRE CLIPS

(75) Inventors: Tsung-Lung Lee, Tu-chen (TW); Zhi-Gang Liu, Shenzhen (CN)

(73) Assignees: Fu Zhun Precision Ind. (Shenzhen) Co., Ltd., Shenzhen (CN); Foxconn Technology Co., Ltd., Tu-Cheng (TW)

( * ) Notice: Subject to any disclaimer, the term of this patent is extended or adjusted under 35 U.S.C. 154(b) by 305 days.

(21) Appl. No.: 10/893,626

(22) Filed: Jul. 16, 2004

(65) Prior Publication Data

US 2005/0013121 A1   Jan. 20, 2005

(30) Foreign Application Priority Data

Jul. 16, 2003   (TW) ............................... 92212984 U

(51) Int. Cl.
 *G06F 1/16* (2006.01)
(52) U.S. Cl. ...................................... 361/720; 361/704
(58) Field of Classification Search ................ 361/720, 361/704, 707, 718, 719; 357/718, 719; 248/505, 248/510
See application file for complete search history.

(56) References Cited

U.S. PATENT DOCUMENTS

| | | | | |
|---|---|---|---|---|
| 5,138,524 A | * | 8/1992 | Smithers | 361/704 |
| 5,329,426 A | | 7/1994 | Villani | |
| 5,842,512 A | * | 12/1998 | Guerrero | 165/80.3 |
| 5,864,464 A | * | 1/1999 | Lin | 361/697 |
| 5,884,692 A | * | 3/1999 | Lee et al. | 165/80.3 |
| 5,896,270 A | * | 4/1999 | Tsui | 361/704 |
| 6,049,457 A | * | 4/2000 | Lee | 361/704 |
| 6,317,323 B1 | * | 11/2001 | Lee et al. | 361/704 |
| 6,424,530 B1 | | 7/2002 | Lee et al. | |
| 6,450,249 B1 | * | 9/2002 | Liu | 165/80.3 |
| 6,470,962 B1 | * | 10/2002 | Pao | 165/80.3 |
| 6,496,371 B2 | * | 12/2002 | Winkel et al. | 361/703 |
| 6,600,650 B1 | * | 7/2003 | Lee | 361/697 |
| 6,992,893 B2 | * | 1/2006 | Miyamura et al. | 361/705 |
| 2004/0017662 A1 | * | 1/2004 | Liu | 361/719 |

FOREIGN PATENT DOCUMENTS

| | | |
|---|---|---|
| TW | 267586 | 1/1996 |
| TW | 358564 | 5/1999 |
| TW | 499151 | 8/2002 |
| TW | 501866 | 9/2002 |
| TW | 521845 | 2/2003 |

* cited by examiner

*Primary Examiner*—Lisa Lea-Edmonds
(74) *Attorney, Agent, or Firm*—Wei Te Chung

(57) ABSTRACT

A heat dissipation device includes a retention frame (60), a heat sink (40) and a pair of wire clips (20). The retention frame is mounted on a PCB (120) having an electronic component (140) thereon. The heat sink is surrounded in the retention frame. The heat sink includes a base (42) attached on the electronic component and a plurality of fins (44) extending from the base. The base defines holes (46) at opposite sides thereof along a length direction of the fins. Receiving spaces (48) are defined in the heat sink above the holes respectively. The clips respectively include resilient arms (26) received in the receiving spaces and pins (28) extending from the arms. The pins are received in the holes. A pair of latching portions (24) depends from each of the clips and are engaged with the retention frame, to thereby secure the heat sink to the electronic component.

16 Claims, 4 Drawing Sheets

HEAT DISSIPATION DEVICE INCLUDING WIRE CLIPS

BACKGROUND OF THE INVENTION

1. Field of the Invention

The present invention relates to heat dissipation devices for removing heat from electronic components, and more particularly to a heat dissipation device which comprises wire clips to secure a heat sink to an electronic component.

2. Description of Related Art

Conventional heat dissipation devices used for removing heat from electronic components comprise heat sinks and metal piece clips for securing the heat sinks. The clips have complex structures and are laborious in manufacture.

FIG. 4 shows a heat dissipation device 100 having clips 170, 180 with simple structures. The clips 170, 180 are made from metal wires. The heat sink 160 is placed on the electronic component 140 which is mounted on a socket 120. The socket 120 forms a pair of ears 124 at opposite sides thereof. The heat sink 160 defines a pair of grooves 164 at opposite outer sides thereof. The clip 170 comprises a central latch portion 174 and a pair of arm portions 172 extending perpendicularly from opposite ends of the latch portion 174. The clip 180 comprises a central latch portion 184 and a pair of arm portions 182 extending perpendicularly from opposite ends of the latch portion 184. In assembly, the clips 170, 180 are opposite to each other, with the arm portions 172, 182 inserted into the grooves 164. The clips 170, 180 are depressed so that the latch portions 174, 184 are snappingly engaged with the ears 124 of the socket 120.

The clips 170, 180 both have simple structures relative to metal piece clips. However, the latch portions 174, 184 are far away from the arm portions 172, 182 of the clips 170, 180, there is no any action taken to protect the clips 170, 180 from deformation. Permanent deformation of the clips 170, 180 is prone to occur after long term use or with overload. Furthermore, the clips 170, 180 are made from metal wires, thus, depression of the clips 170, 180 is unduly inconvenient without any assistance of other elements.

SUMMARY OF THE INVENTION

Accordingly, an object of the present invention is to provide a heat dissipation device which comprises a heat sink and a pair of simply structured clips for permanently firmly securing the heat sink to an electronic component.

In order to achieve the object set out above, a heat dissipation device in accordance with a preferred embodiment of the present invention comprises a retention frame, a heat sink and a pair of wire clips. The retention frame is mounted on a PCB having an electronic component thereon. The heat sink is surrounded in the retention frame. The heat sink includes a base attached on the electronic component and a plurality of fins extending from the base. The base defines holes at opposite sides thereof along a length direction of the fins. Receiving spaces are defined in the heat sink above the holes respectively. The clips respectively include resilient arms received in the receiving spaces and pins extending from the arms. The pins are received in the holes. A pair of latching portions depends from each of the clips and are engaged with the retention frame, to thereby secure the heat sink to the electronic component.

Other objects, advantages and novel features of the present invention will become more apparent from the following detailed description when taken in conjunction with the accompanying drawings, in which:

DETAILED DESCRIPTION OF THE INVENTION

Figure 1:
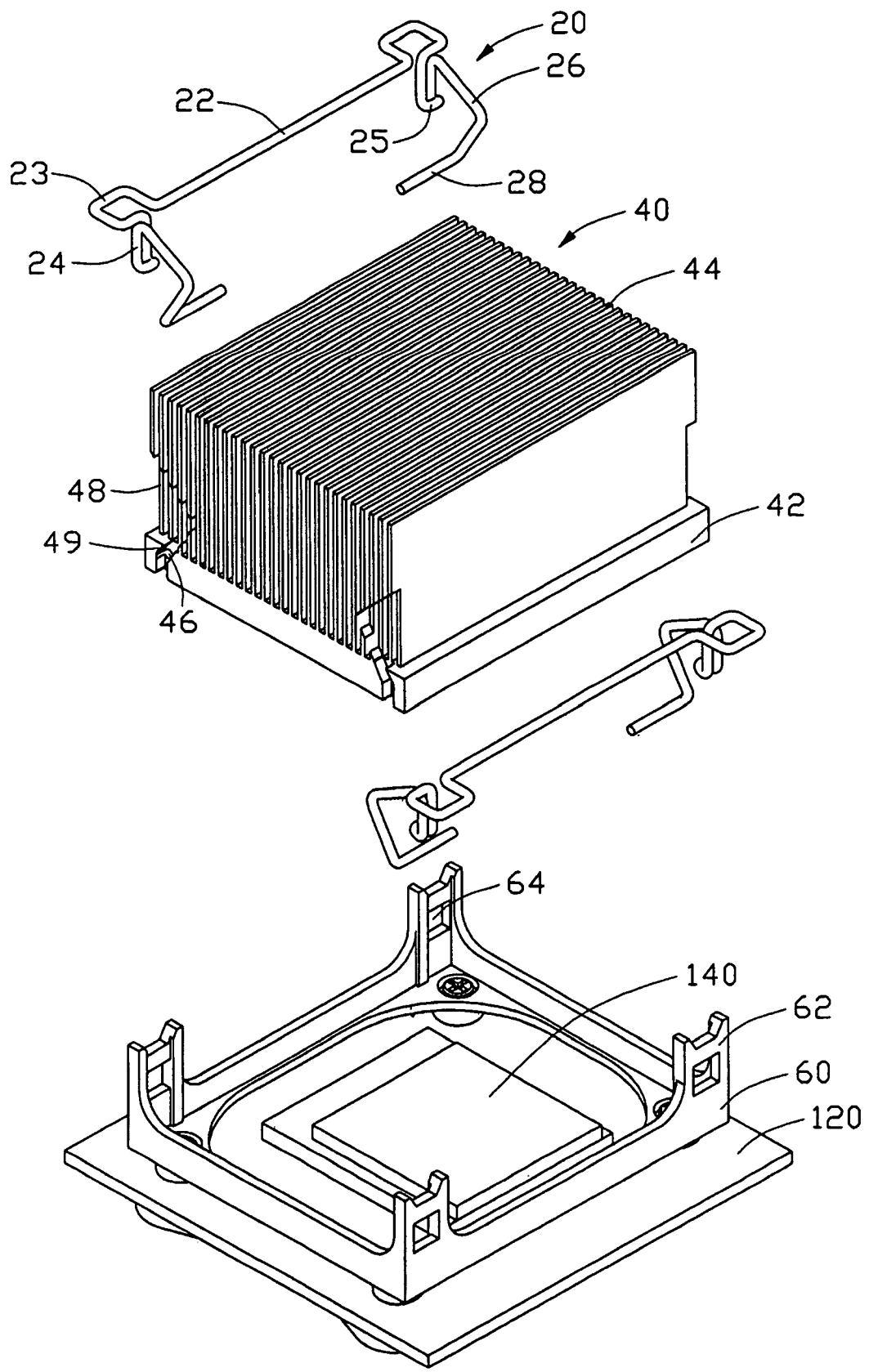
FIG. 1 is an exploded, isometric view of a heat dissipation device in accordance with the preferred embodiment of the present invention.
Figure 2:
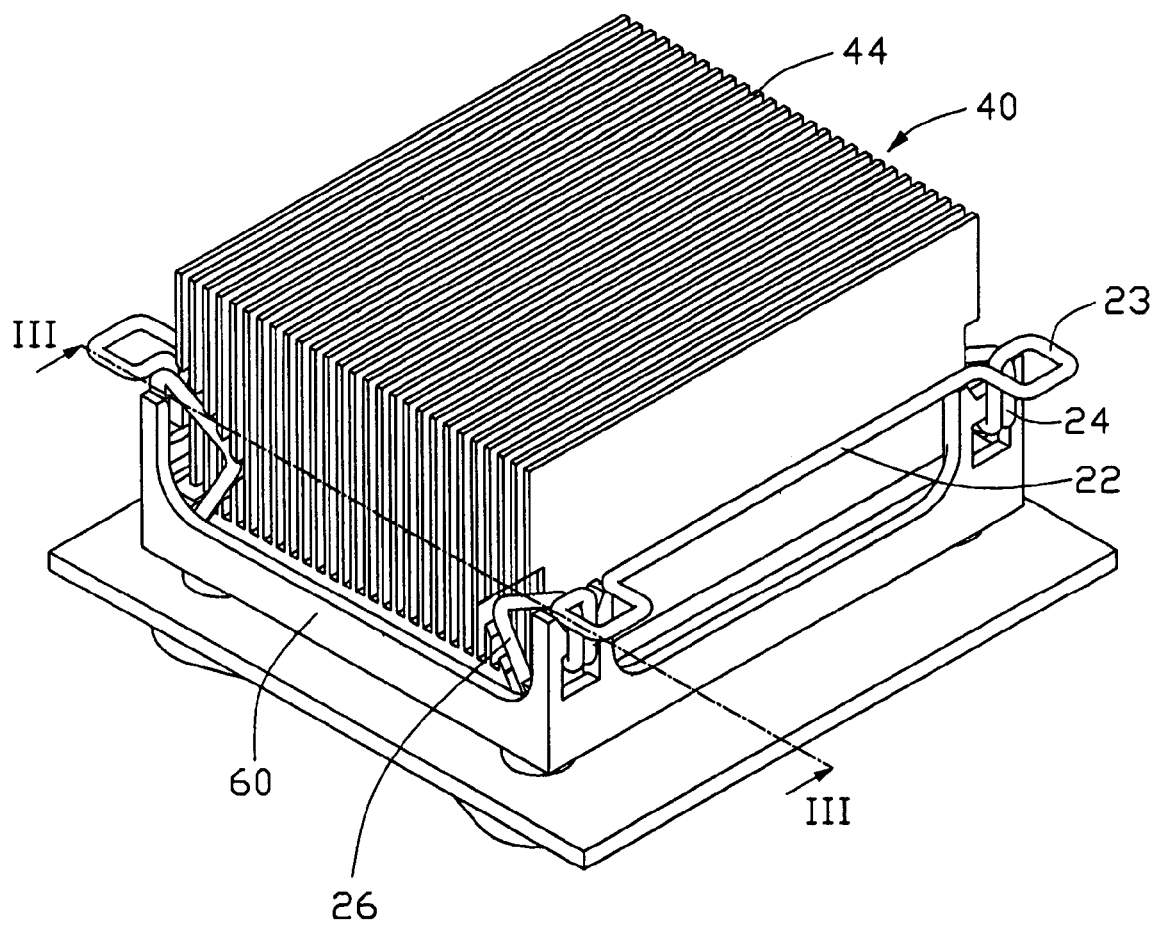
FIG. 2 is an assembled view of FIG. 1.
Figure 3:
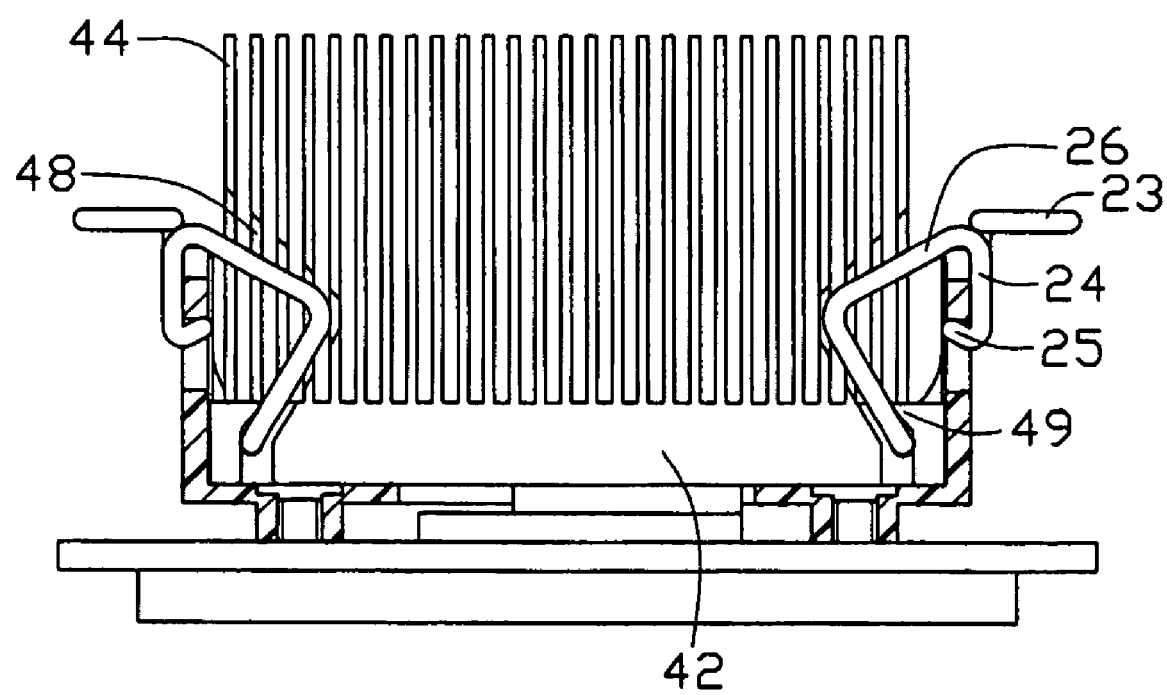
FIG. 3 is a cross sectional view of FIG. 2, taken along line III—III.
Figure 4:
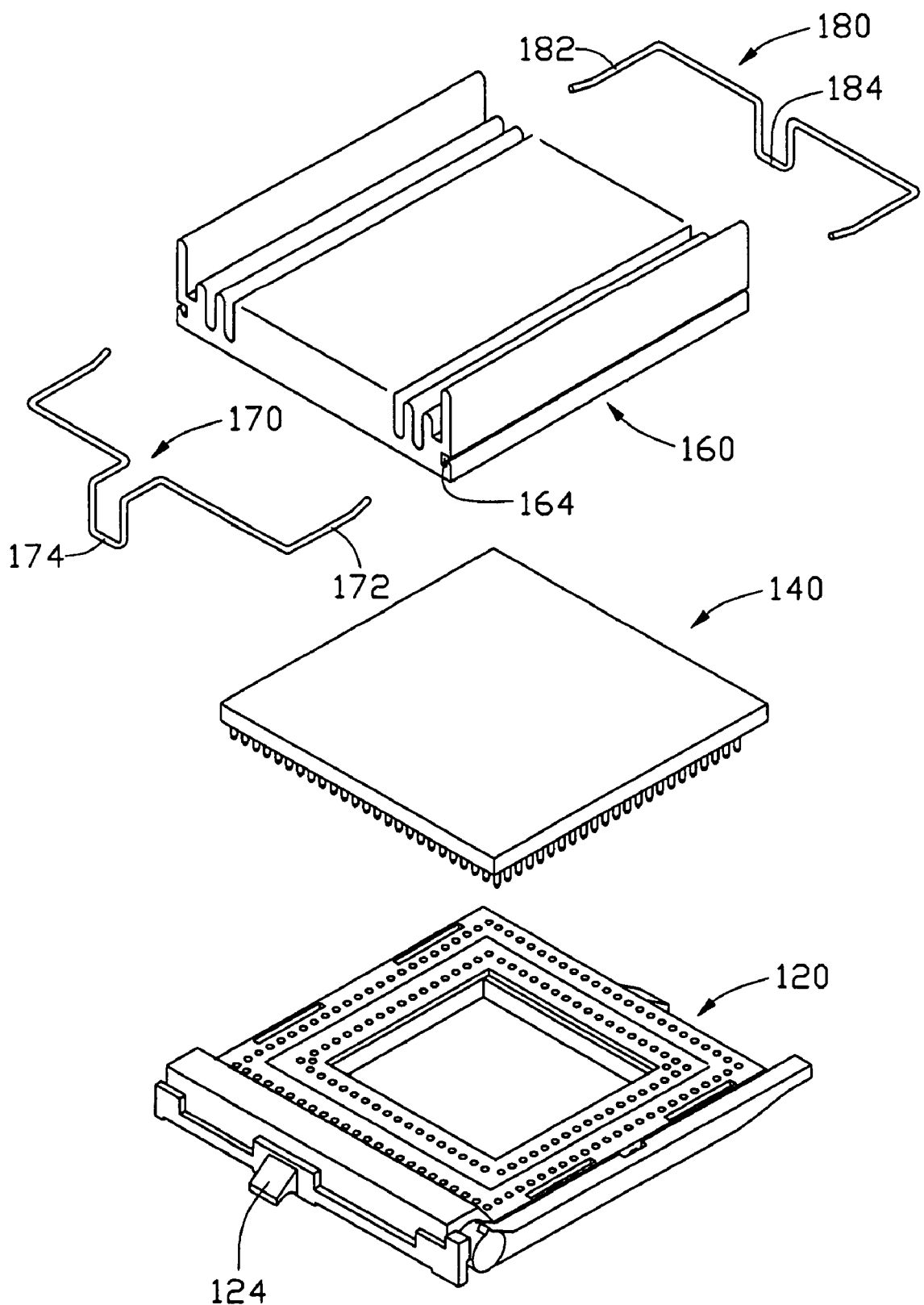
FIG. 4 is an exploded view of a conventional heat dissipation device.

Referring to FIGS. 1–3, a heat dissipation device in accordance with the preferred embodiment of the present invention comprises a pair of clips 20, a heat sink 40, a retention frame 60. The retention frame 60 is mounted on a printed circuit board (PCB) 120. An electronic component 140 is mounted on the PCB 120 and surrounded by the retention frame 60. The clips 20 are engaged with the retention frame 60 for securing the heat sink 40 to the electronic component 140 for removal heat therefrom.

The retention frame 60 comprises four posts 62 extending upwardly from opposite ends of opposite edges thereof respectively. An aperture 64 is defined in each post 62 distal from a base of the retention frame 60.

The heat sink 40 comprises a base 42, and a plurality of parallel fins 44 extending upwardly from the base 42. Four holes 46 are defined respectively in opposite portions of opposite sides thereof, extending along a length direction of the fins 44. Part of the fins 44 and the base 42 above each hole 46 is cut out to form a receiving space 48 which is in communication with the hole 46. Each receiving space 48 has a substantial V-shaped profile along a transverse direction relative to the fins 44. A block 49 is formed on the base 42 above the corresponding hole 46. The blocks 49 are located in the receiving spaces 48.

Each clip 20 is made from a metal wire, and comprises a horizontal beam 22. A pair of operating portions 23 is formed at opposite ends of the beam 22. The operating portions 23 are at a first side of the beam 22 and coplanar with the beam 22. A pair of latching portions 24 extends downwardly from operating portions 23 respectively. Each latching portion 24 has a central bottom latch 25 located at an opposite second side of the beam 22. A pair of V-shaped arms 26 extends downwardly from free top ends of latching portions 24 respectively. Each arm 26 extends firstly toward the second side of the beam 22 and then extends toward the first side of the beam 22. A pin 28 extends from a free end of each arm 26, the pins being parallel to the beam 22 and below the latches 25.

In assembly of the heat dissipation device, the clips 20 are placed at opposite sides of the heat sink 40, with the pins 28 received in the holes 46 of the heat sink 40. The arms 26 are then received in the receiving spaces 48 of the heat sink 40. The blocks 49 prevent the arms 26 from moving out of the receiving spaces 48. The combined heat sink 40 and clips 20 is placed into the retention frame 120, with the heat sink 40 contacting the electronic component 140. The operating portions 23 are depressed so that the latching portions 24 move toward the posts 62 until the latches 25 are engagingly received in the apertures 64. At this stage, the retention frame 60 exerts a force on the latches 25 so that the arms 26 are deformed. The deformation of the arms 26 creates a contrary force on the heat sink 40. The blocks 29 protect the clips 20 under forces from displacement.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation device comprising:
    a retention frame mounted on a PCB having an electronic component thereon;
    a heat sink surrounded in the retention frame, the heat sink comprising a base attached on the electronic component and a plurality of fins extending from the base, the heat sink defining holes in the base and voids above the holes respectively; and
    a pair of wire clips disposed at opposite sides of the heat sink and engaged with the retention frame, the clips respectively comprising resilient arms received in the voids and pins extending from the arms, the pins being received in the holes respectively.

2. The heat dissipation device of claim 1, wherein a pair of operating portions is disposed at opposite ends of the clips.

3. The heat dissipation device of claim 2, wherein the operating portions and the arms are located at opposite sides of the clips, respectively.

4. The heat dissipation device of claim 2, wherein a pair of latching portions extends downwardly from free ends of the operating portions of each of the clips, the arms extend from free ends of the latching portions of each of the clips.

5. The heat dissipation device of claim 4, wherein posts extend from a base of the retention frame, the posts being engaged with the latching portions.

6. The heat dissipation device of claim 5, wherein a central bottom latch is formed at each of the latching portions, an aperture is defined in each of the posts distal from the base of the retention frame, the latches being engagingly received in the apertures.

7. The heat dissipation device of claim 2, wherein a beam connects the operating portions of each of the clips, the pins being substantially parallel to the beam.

8. The heat dissipation device of claim 1, wherein blocks are formed on the base above corresponding holes, the blocks projecting the clips under forces from displacement.

9. The heat dissipation device of claim 1, wherein each of the arms is V-shaped, each of the voids has a V-shaped profile corresponding to the arms.

10. A heat dissipation device comprising:
    a retention frame mounted on a PCB having an electronic component thereon;
    a heat sink surrounded in the retention frame, the heat sink comprising a base attached on the electronic component and defining voids therein; and
    wire clips, each of the clip in turn comprising a first section engaged in the base of the heat sink, a second section received in a corresponding void of the heat sink, and a third section beyond the heat sink, wherein when the third sections are engaged with the retention frame the clips are deformed under pressure.

11. The heat dissipation device of claim 10, wherein the heat sink comprises a plurality of parallel fins extending perpendicularly from the base, and the first section of each of the clips extends along a length direction of the fins.

12. The heat dissipation device of claim 11, wherein the voids are defined at opposite sides of the heat sink, and each of the voids has a substantially V-shaped profile along a transverse direction relative to the fins to associate with a corresponding second section.

13. The heat dissipation device of claim 10, wherein the heat sink forms blocks in the voids respectively, for preventing the clips under forces from displacement.

14. A beat dissipation device assembly comprising:
    a printed circuit board;
    a heat generating device located on the printed circuit board;
    a heat sink seated on the heat generating device, and including a base with a plurality of fins thereon, the heat sink defining a pair of lengthwise side faces and a pair of lateral sides faces perpendicular to each other, a pair of holes located in said two lateral side faces, respectively, and extending inwardly in a first axis parallel to said lengthwise side faces, and a pair of recesses located around the holes in the corresponding two lateral side faces, respectively; and
    a clip located on one of said two lengthwise side face and close to said pair of holes, said clip including a pair of resilient arms snugly receiveably and protectively engaged within the corresponding recesses, respectively, and a pair of pins extending from tips of the corresponding pair of resilient arms along the first axis and snugly received in the corresponding holes, respectively, an operation portion and a latching portion connected to at least one resilient arm; wherein
    said operation portion and said latching portion are commonly located beside said one of the lengthwise side faces; and
    wherein said latching portion is locked into an opening defined in a retention module surrounding the heat sink.

15. The heat dissipation device assembly as claimed in claim 14, wherein said latching portions essentially extend in a second axis perpendicular to said first axis.

16. The heat dissipation device assembly as claimed in claim 14, wherein there are a pair of operation portion and the corresponding latching portion respectively connected to the corresponding resilient arms and linked to each other by a beam.

* * * * *